(12) United States Patent
von der Embse

(10) Patent No.: US 7,337,383 B1
(45) Date of Patent: Feb. 26, 2008

(54) DECISIONING RULES FOR TURBO AND CONVOLUTIONAL DECODING

(75) Inventor: Urbain Alfred von der Embse, Westchester, CA (US)

(73) Assignee: Urbain A. von der Embse, Westchester, CA (US)

( * ) Notice: Subject to any disclaimer, the term of this patent is extended or adjusted under 35 U.S.C. 154(b) by 544 days.

(21) Appl. No.: 10/772,597

(22) Filed: Feb. 6, 2004

(51) Int. Cl.
*H03M 13/29* (2006.01)
*H03M 13/45* (2006.01)

(52) U.S. Cl. .................. 714/755; 714/780; 714/786
(58) Field of Classification Search ............ 714/780, 714/755, 786
See application file for complete search history.

(56) References Cited

U.S. PATENT DOCUMENTS 5,815,515 A * 9/1998 Dabiri ...................... 714/795

7,076,000 B2 * 7/2006 Rodriguez .................. 375/262

OTHER PUBLICATIONS

Hagenauer et al, "Iterative Decoding of Binary Block and Convolutional Codes", IEEE Transactions on Information Theory, vol. 42, No. 2, Mar. 1996, pp. 429-445*

* cited by examiner

*Primary Examiner*—Stephen M. Baker

(57) ABSTRACT

New and improved a-posteriori decoding probabilities, decisioning metrics, and implementation algorithms for turbo and convolutional decoding to replace the probabilities and decisioning metrics currently used in the maximum likelihood ML and maximum a-posteriori MAP algorithms. A-posteriori probabilities $p(x|y)$ replace the current ML probabilities $p(y|x)$ wherein y is the received symbol and x is the transmitted data and the MAP a-posteriori probability $p(s',s|y)$ replaces the current MAP joint probability $p(s',s,y)$ wherein s',s are the trellis decoding states at k-1, k and y is the observed data set $y(k), k=1, 2, \ldots, N$. This yields a-posteriori probabilities and decisioning metrics to improve decisioning and bit error rate BER performance and to provide a new mathematical decoding framework. Complexity is the same as current implementations.

3 Claims, 8 Drawing Sheets

Performance our MX decisioning metric
$\ln[f(x|y)]$ vs. the ML decisioning metric $\ln[f(y|x)]$

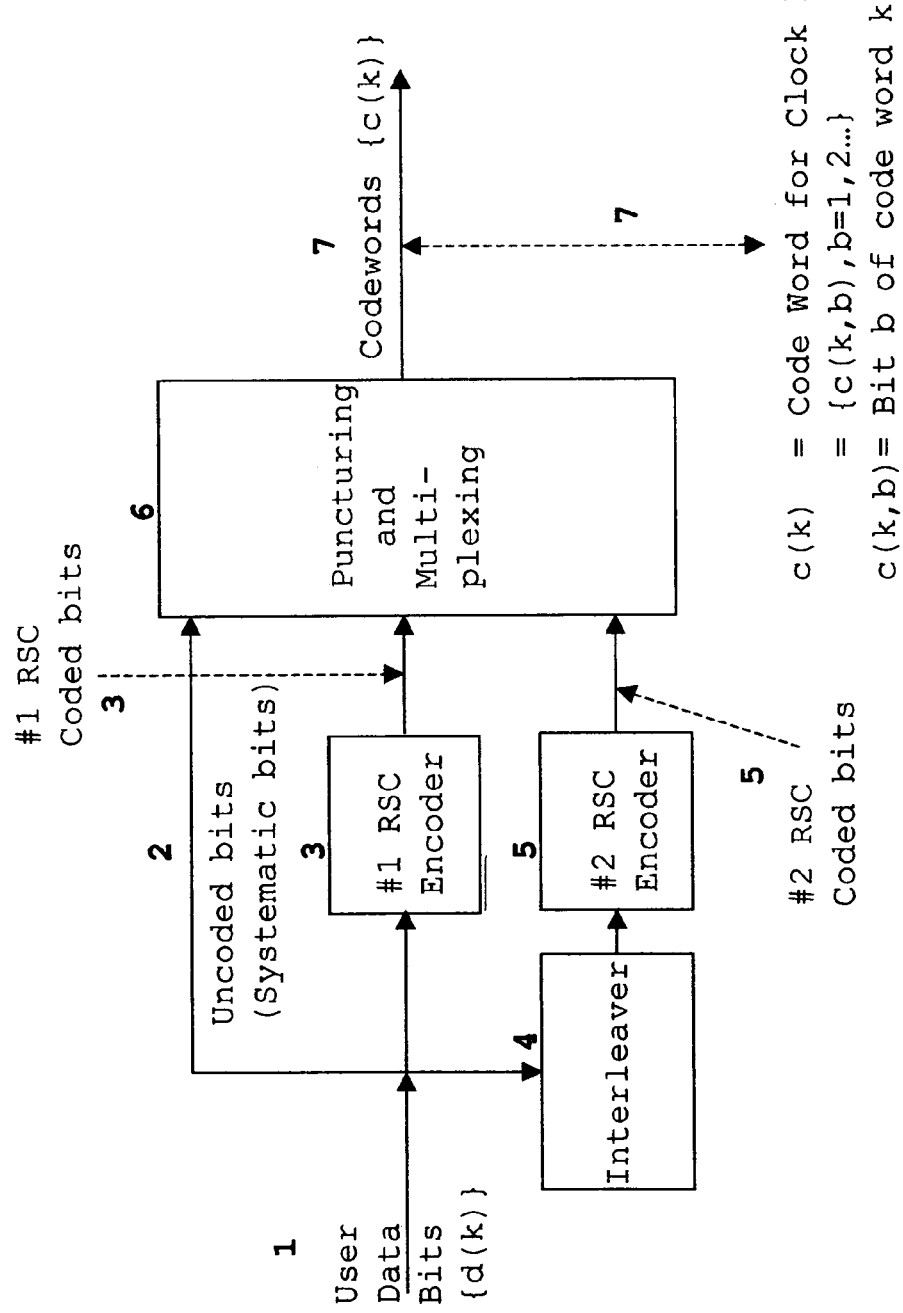
FIG. 1 Prior Art: Turbo Encoder Block Diagram for Parallel Architecture

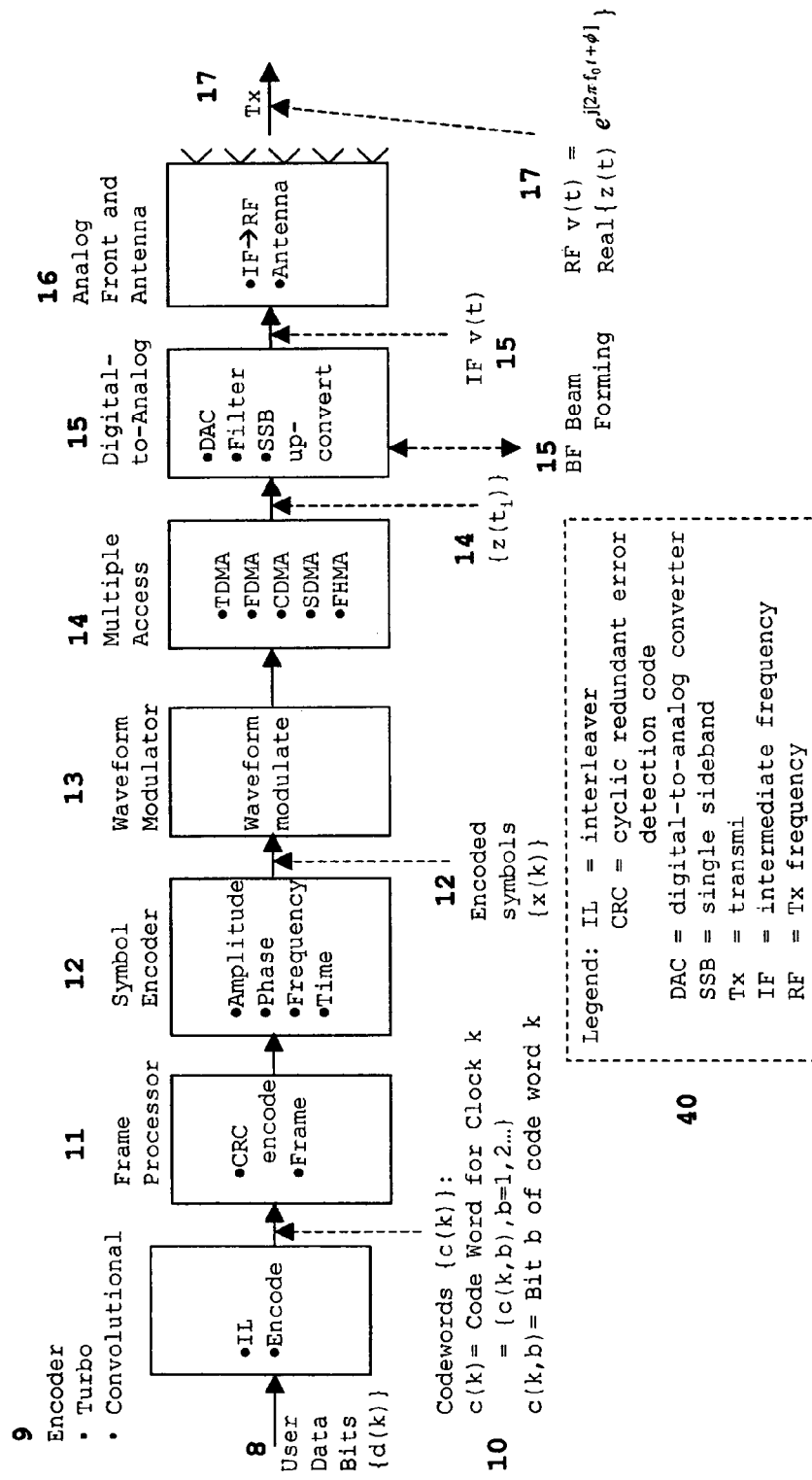
FIG. 2  Prior Art: Turbo/Convolutional Code Transmitter Block Diagram

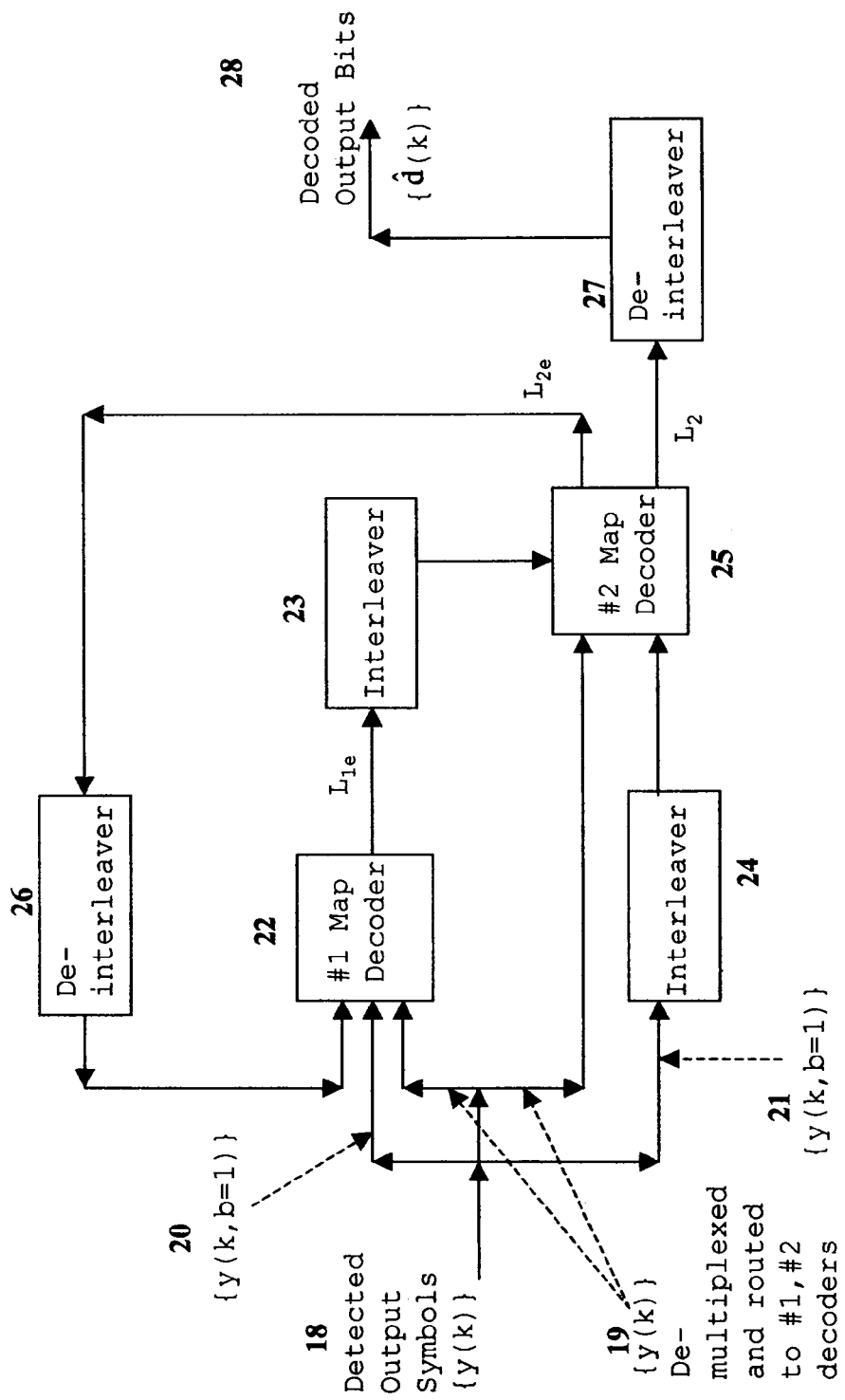
FIG. 3 Prior Art: Iterative Turbo Decode Block Diagram for Parallel Architecture

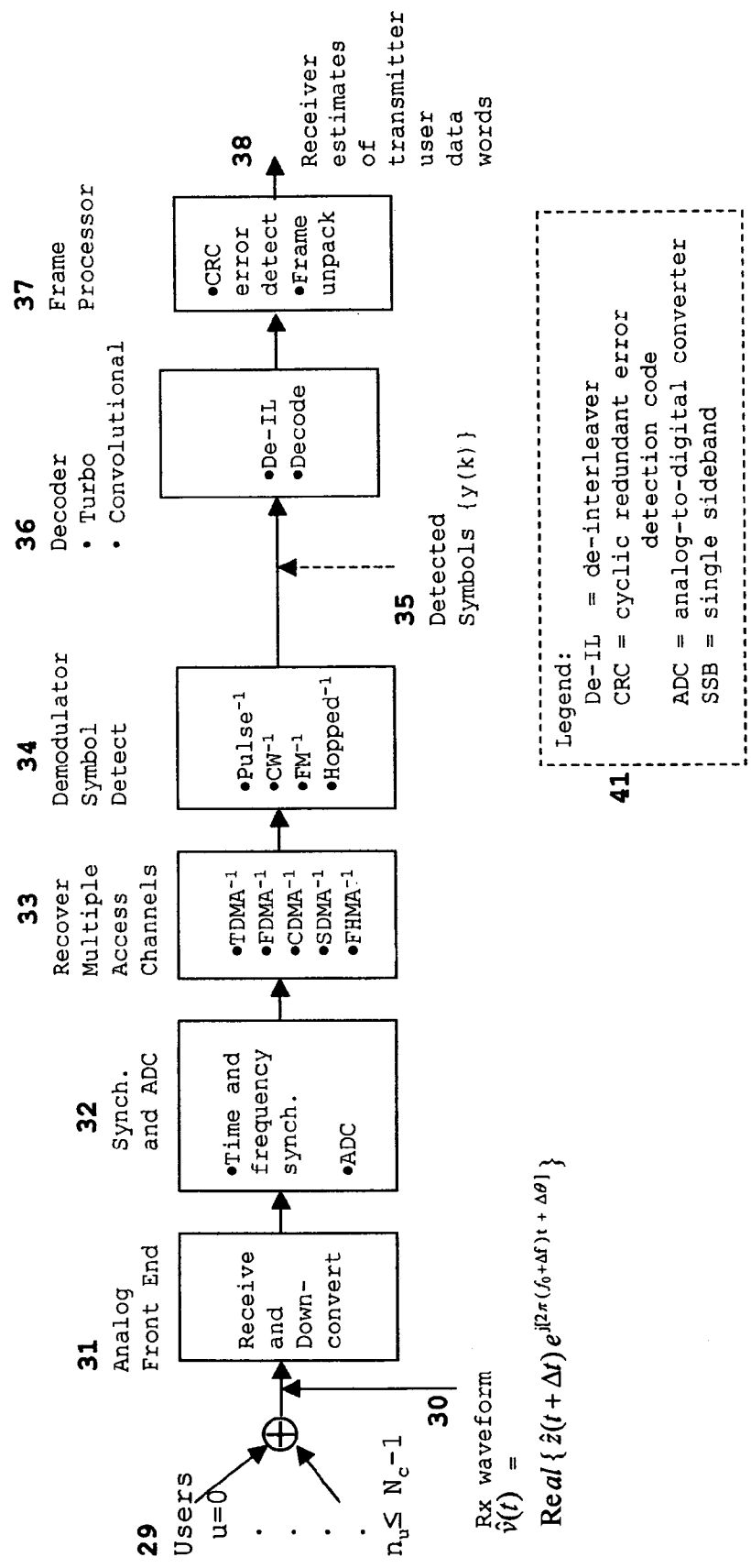
FIG. 4 Prior Art: Turbo/Convolutional Code Receiver Block Diagram

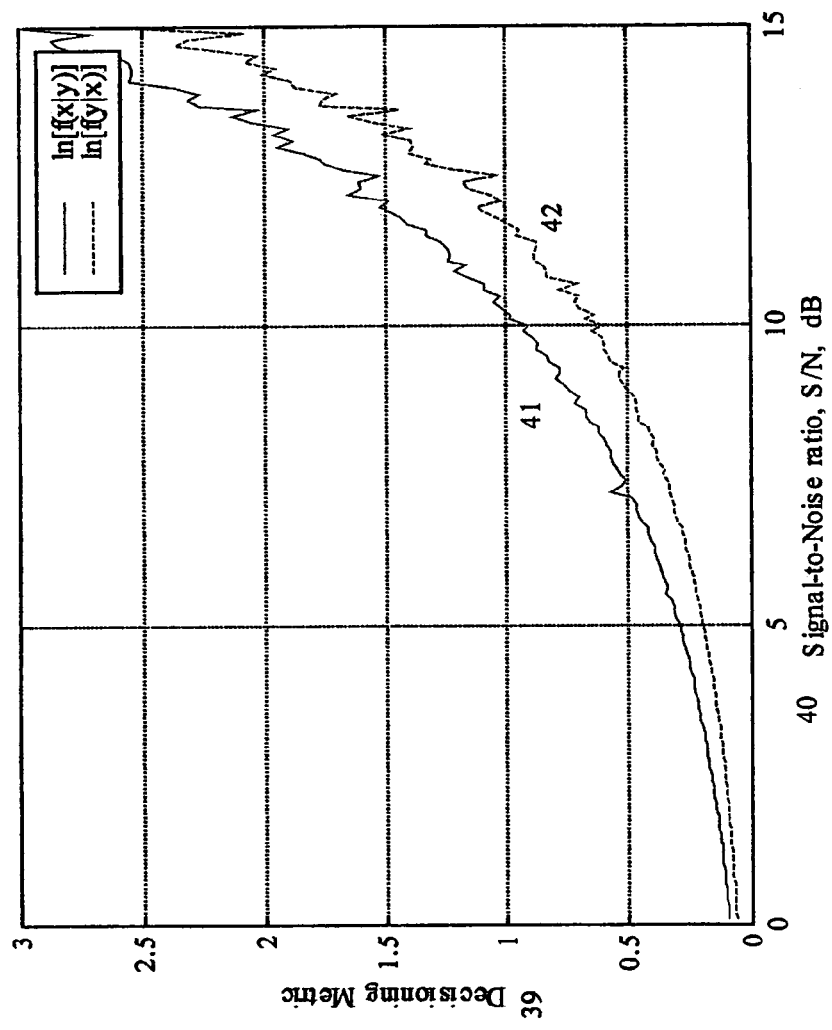
FIG. 5 Performance our MX decisioning metric ln[f(x|y)] vs. the ML decisioning metric ln[f(y|x)]

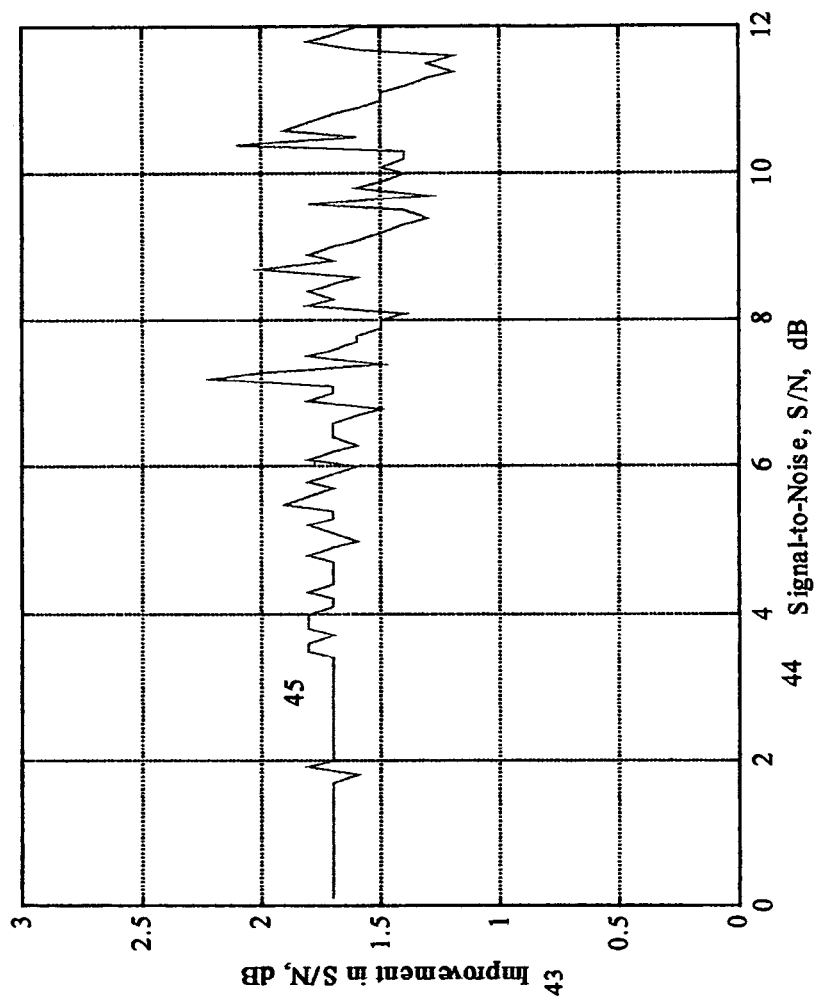
FIG. 6 Improvement in S/N using our new MX Decisioning metric DX vs. the ML metric DM

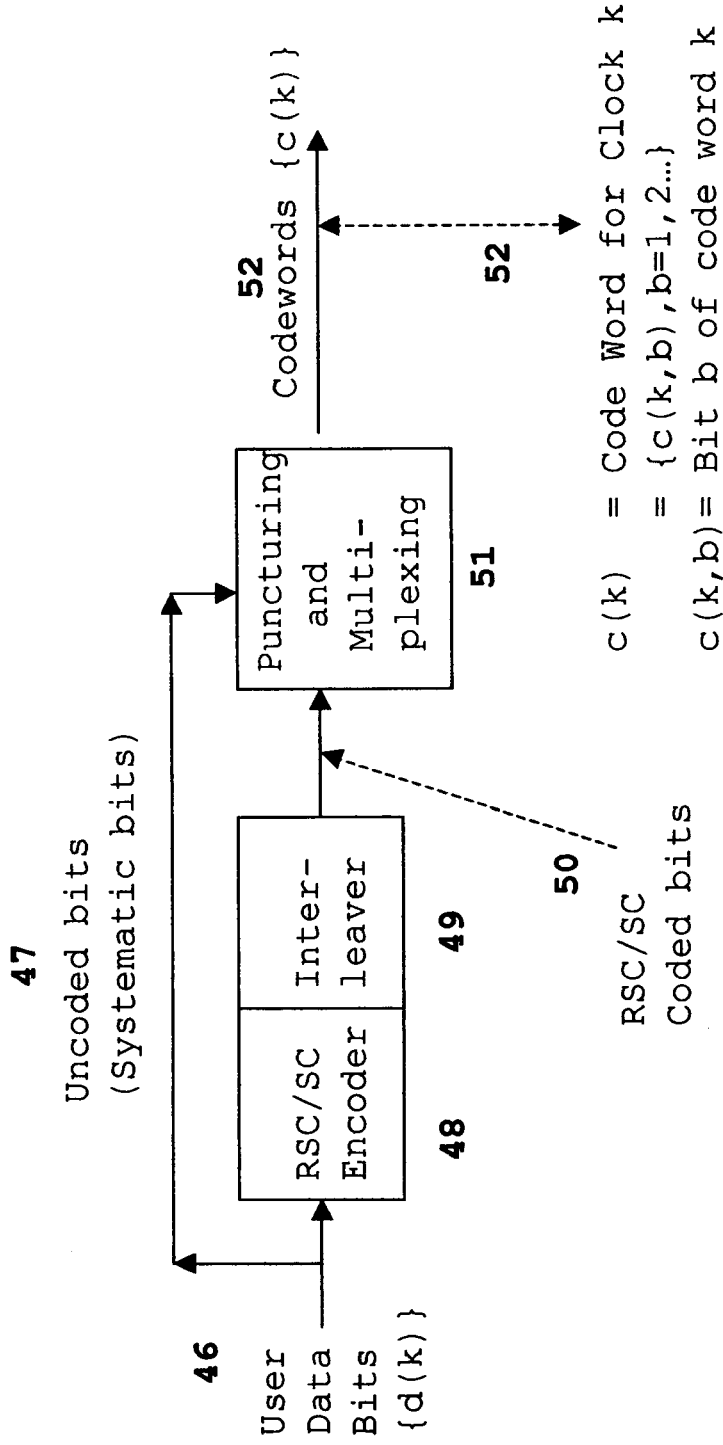
FIG. 7 Prior Art: Convolutional Encoder Block Diagram

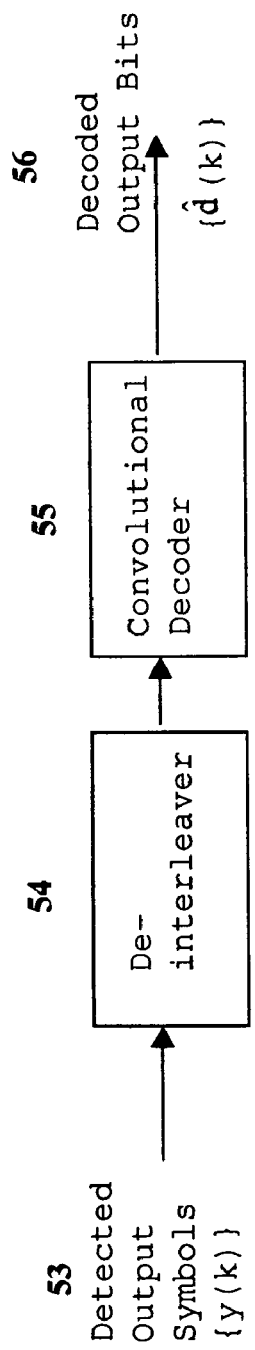
FIG. 8  Prior Art: Convolutional Decoder Block Diagram

DECISIONING RULES FOR TURBO AND CONVOLUTIONAL DECODING

BACKGROUND OF THE INVENTION

I. Field of the Invention

The present invention relates to both convolutional decoding and to turbo decoding for communications applications and in particular to mobile, point-to-point and satellite communication networks, CDMA (Code Division Multiple Access) and OFDMA (Orthogonal Frequency Division Multiple Access) cellular telephone and wireless data communications with data rates to multiple T1 (1.544 Mbps) and higher (>100 Mbps), and to optical WDMA (Wavelength Division Multiple Access) links with data rates to >100 GBps (Gega bit per second) and higher ranges. More specifically the present invention relates to novel a-posteriori probabilities and decisioning metric paradigms and architectures which reduce the number of arithmetic multiply operations and thereby reduce the computational complexity, improve iterative convergence thereby reducing complexity, improve bit error rate (BER) performance, and provide new metric processing algorithms to support the various decoding algorithms.

II. Description of the Related Art

Current art is represented by the recent IEEE publication in reference [1] which summarizes the theoretical and applications work on turbo codes, books on turbo codes in references [2], [3], [4], [5], [6], [7], [8] and the reference text on the theoretical foundations of probability and decisioning metrics [9]. In addition there are the fundamental patents on turbo decoding.

Maximum likelihood ML decisioning metrics DM are currently used in turbo and convolutional decoding wherein DM is the natural logarithm of the ML probability which is the conditional Gaussian probability of the observed communications channel output symbol y assuming that the transmitted symbol is x. This defines the decisioning metric DM in equations (1) where ln is the natural logarithm and log is the logarithm. Reference to log is understood to mean the natural logarithm since it is always (1) Decisioning Metric DM 1 mL probability $p(y|x)$ is the Gaussian conditional probability $$p(y|x) = \exp(-|y-x|^2/2\sigma^2)/(2\pi)^{1/2}\sigma$$

2 Log of the ML $$\ln[p(y|x)] = -|y-x|^2/2\sigma^2 - \ln[(2\pi)^{1/2}\sigma]$$

3 Decisioning metric DM is the logarithm of the ML probability with the additive constant term removed $$DM(y,x) = -|y-x|^2/2\sigma^2$$

wherein the constant $1/2\sigma^2$ scales the DM relative to the noise floor $2\sigma^2$ of the symbol detector used in turbo decoding and in convolutional decoding. Step 1 is the definition of the zero-mean conditional Gaussian probability density function. Step 2 is the log. Step 3 is the decisioning metric DM that measures the distance between y and x, where $\sigma$ is the one sigma value of the inphase and the quadrature noise. This DM metric is used in the convolutional decoding algorithm, and in the turbo decoding algorithm when combined with the a-priori probability of the correct decoding bit. The DM metric is a ML distance metric and the functional form is determined by the zero-mean Gaussian assumption for the link and receiver processing noise.

Maximum a-posteriori probability MAP turbo decoding starts with a sequence of observed channel output symbols $\{y(k), k=1, 2, \ldots, N\}$ of the receiver where k is the running index over the N transmitted symbols.

FIG. 1 is a representative turbo encoder block diagram for a parallel architecture. Input 1 to the encoder are the user data bits $\{d(k)\}$ for $k=1, 2, \ldots, N$. The encoder for a turbo code uses a recursive systematic code RSC which means the first codeword bit 2 is the user data bit called systematic bit, or bits, which are uncoded. These user data bits $\{d(k)\}$ are also handed over to the first RSC encoder 3 called #1 encoder, and after interleaving 4 are also handed over to the second RSC encoder 5 called #2 encoder. User data bits and the encoder output bits are punctured 6 to obtain the correct code rate and then multiplexed into a continuous output bit stream 7 of codewords $\{c(k)\}$ for each of the codeword clocks $k=1, 2, \ldots, N$. Each codeword $c(k)$ is a set of bits consisting of the systematic bits, #1 encoder output bits, and #2 encoder output bits.

FIG. 2 is a representative transmitter block diagram for implementation of both the turbo encoder in FIG. 1 and the convolutional encoder in FIG. 7. Signal processing starts with the input stream $\{d(k)\}$ of user data bits 8 to the convolutional/turbo encoder 9. Output 10 of the convolutional/turbo encoder in FIG. 1 are the stream of codewords $\{c(k)\}$ handed over to the frame processor. Frame processor 11 accepts these codewords and performs error detecting coding such as a CRC (cyclic redundant code) and frame formatting, and passes the outputs to the symbol encoder 12 which encodes the data onto amplitude and phase with possible frequency and time assignments and whose outputs are the transmitter symbols $\{x(k)\}$ corresponding to the codewords of the convolutional/turbo encoder output as well as the other symbols for the frame data including the CRC. Framing can be done before and/or after the turbo encoding. Transmitter symbols $\{x(k)\}$ are modulated 13 into a waveform. Modulator output signals for multiple channels are multiple-access processed and combined 14 for handover 14 as a stream of complex baseband digital signal samples $\{z(t_i)\}$ where $t_i$ is a time index, to the digital-to-analog conversion 15 which converts the complex baseband input signal from the multiple access processing into a single sideband SSB upconverted real signal $v(t)$ 15 at an intermediate frequency IF where $\{z(t_i)\}$ is the stream of complex baseband signal input samples at the digital times $\{t_i\}$ to the digital-to-analog conversion. The digital-to-analog processing also includes beam forming calculations for both digital and analog beam-forming antennas. Multiple access examples in 14 are time division multiple access TDMA, frequency division FDMA, code division CDMA, space division SDMA, frequency hop multiple access FHMA, and all combinations of these and others not mentioned but inferred from this representative list.

For multiple beam antennas 16 in FIG. 2 the beam coefficients for each beam element for each complex digital sample are processed 15 and the individual digital streams are handed off to the corresponding antenna elements where they are SSB upconverted to an IF and processed by the analog front end 16 at each element and the array of elements form the beams and within each beam the transmitted signal is similar to the real RF signal $v(t)$ in 17 for a single beam. For single beams the analog front end 16 upconverts and amplifies this IF signal and transmits it as the real RF signal $v(t)$ 17. This real waveform $v(t)$ 17 is at the RF carrier frequency $f_0$ and is the real part of the complex envelope of the baseband waveform $z(t)$ multiplied by the RF carrier with the phase angle φ which accounts for the phase change from the baseband signal to the transmitted signal.

MAP (maximum a-posteriori probability) joint probability used in the MAP turbo decoding algorithm is defined in equations (2) which are taken from references [1],[2]. Definition 1 introduces common terminology in (2) MAP Joint Probability for Turbo Decoding 1 Definitions $$S(k) = \text{Decoder trellis state at clock } k$$
$$= \text{Decoder shift register state at clock } k$$
$$k = \text{Index of received codewords}$$
$$= \text{trellis decoder states}$$
$$= \text{decoding clock}$$
$$s', s = \text{Values of } S(k-1), S(k) \text{ respectively}$$
$$y = \text{Set of observed channel output symbols}$$
$$= \{y(k), k = 1, 2, \ldots, N\}$$
$$RSC = \text{Recursive systematic code}$$
$$= \text{Systematic code } SC \text{ with feedback which is a requirement for turbo decoding}$$

Parallel encoding=Encoding configuration for turbo decoding which transmits the symbols using a parallel architecture, which is the assumed architecture for this invention disclosure
y(k)=Output symbols for codeword/clock k
{y(j<k)}=Output symbols for clocks j=1, 2, . . . , k−1
{y(j>k)}=Output symbols for clocks j=k+1, 2, . . . , N 2 Decoding states and observations
Observations are the set {y(k), k=1, 2, . . . , N}

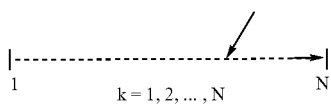

Subsets y(j<k), y(k), y(j>k) of y are of interest

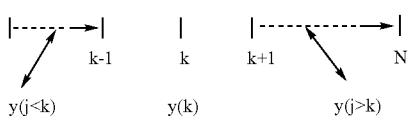

Decoder trellis states of interest are s',s

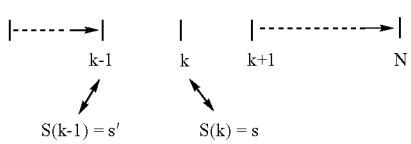

3 MAP joint probability
The joint probability of interest for MAP is $$p(s',s,y)=p(s',s,y(j<k),y(k),y(j>k))$$

turbo decoding literature. In 2 the decoding states s',s are defined at clocks k−1,k and the observations are defined over the j=1, 2, . . . , k−1 as y(j<k), over j=k+1, . . . , N as y(j>k), and at k as y(k). In 3 the MAP joint probability is defined as a function of these decoder states and observations.

Recursive equation for the MAP joint probability is derived in equations (3) by reformulating the joint probability equation in 3 in equations (2) as a function of the recursive state estimators α,β and the state transition probability γ. Step 1 is the application of Bayes rule to partition the joint probability. Step 2 takes advantage of the assumption that the (3) Recursive Formulation of MAP Joint Probability 1 Bayes theorem or rule p(a,b)=p(a|b)p(b) can be used to rewrite the MAP joint probability in 3 in equation (2)

$$p(s', s, y) = p(s', s, y(j<k), y(k), y(j>k))$$
$$= p(y(j>k)|s', s, y(j<k), y(k)) *$$
$$p(s', s, y(j<k), y(k)))$$

where "*" is a multiply operation
2 Assuming the channel is memoryless $$p(s',s,y)=p(y(j>k)|s)p(s',s,y(j<k),y(k))$$

3 Re-applying Bayes rule and the assumption that the channel is memoryless $$p(s',s,y)=p(y(j>k)|s)p(s,y(k)|s')p(s',y(j<k))$$

4 This equation can be rewritten as a function of the recursive estimators and state transition probability $$p(s,s',y)=\beta_k(s)\gamma_k(s,s')\alpha_{k-1}(s')$$

where by definition
$\beta_k(s)=p(y(j>k)|s)$
$\gamma_k(s,s')=p(s,y(k)|s')$
$\alpha_{k-1}(s')=p(s',y(j<k))$ channel is memoryless to simplify the partitioning in step 1. Step 3 re-applies the Bayes rule and the memoryless assumption to re-partition the equation and simplify it to the final form used in the MAP algorithm. Step 4 transforms the joint probability in step 3 derived as a product of three probabilities, into the equivalent product of the two estimators $\alpha_{k-1}(s'),\beta_k(s)$ and the state transition probability $\gamma_k(s,s')$ for the MAP algorithm.

Forward recursive equation for the state estimator $\alpha_k(s)$ is derived in equations (4) as a forward recursion which is a function of $\gamma_k(s,s')$ and the previous estimate $\alpha_{k-1}(s')$. Step 1 starts with the definition of $\alpha_k(s)$ which is derived from the equation for $\alpha_{k-1}(s')$ in 4 in equations (3). Step 2 introduces the state s' by observing that the probability summed over all values of s' is equal to the probability with s' excluded. Step 3 applies Bayes rule to partition the probabilities. In step 4 the assumption that the channel is memoryless enables the equation to be simplified to the form used (4) Forward Recursive Equation for $\alpha_k(s)$ 1 Definition of $\alpha_{k-1}(s')$ in 4 in equations (3) gives $$\alpha_k(s)=p(s,y(j<k),y(k))$$

2 This probability can be written as the sum of joint probabilities over all possible states of s'

$$\alpha_k(s)=\Sigma_{all\ s}p(s,s',y(j<k),y(k))$$

3 Applying Bayes rule $$\alpha_k(s)=\Sigma_{all\ s}p(s,s',y(k)|s',y(j<k))p(s',y(j<k))$$

4 Applying the channel memoryless assumption $\alpha_k(s) = \Sigma_{all\ s'} p(s,y(k)|s') p(s',y(j<k))$ 5 Substituting the definitions of $\gamma_k(s,s')$ and $\alpha_{k-1}(s')$ from 4 in equations (3)

$\alpha_k(s) = \Sigma_{all\ s'} \gamma_k(s,s') \alpha_{k-1}(s')$ in the MAP algorithm. In step 5, substitution of $\gamma_k(s,s')$ and $\alpha_{k-1}(s')$ from 4 in equations (3) gives the final form for the recursive equation for $\alpha_k(s)$.

Backward recursive equation for the state estimator $\beta_{k-1}(s')$ is derived as a backward recursion in equations (5) as a function of the $\gamma_k(s,s')$ and the previous estimate $\beta_k(s)$, following the steps in equations (4). Step 1 derives $\beta_{k-1}(s')$ from the equation for $\beta_k(s)$ in 4 in equations (3). Step 2 follows steps 2, 3, 4 in the derivation of $\alpha_k(s)$ in equations (4).

(5) Backward Recursion Equation for $\beta_{k-1}(s')$
1 The definition for $\beta_k(s)$ from 4 in equations (3)

$\beta_{k-1}(s') = p(y(j>k-1)|s')$

2 Following steps similar to steps 2, 3, 4 in equations (4)

$\beta_{k-1}(s') = \Sigma_{all\ s} p(y(j>k)|s) p(s,y(k)|s')$

3 Substituting the definitions of $\gamma_k(s,s')$ and $\beta_k(s)$ from 4 in equations (3)

$\beta_{k-1}(s') = \Sigma_{all\ s} \beta_k(s) \gamma_k(s,s')$

In step 3, substitution $\gamma_k(s,s')$ and $\beta_k(s)$ from 4 in equations (3) gives the final form for the recursive equation for $\beta_{k-1}(s')$.

State transition probability $\gamma_k(s,s')$ and the log, $\underline{\gamma}_k(s,s')$ of $\gamma_k(s,s')$ are derived in equations (6). The $\gamma_k(s,s')$ is the probability of (6) State Transition Probabilities $\gamma_k(s,s'), \underline{\gamma}_k(s,s')$
1 From the definition of $\gamma_k(s,s')$ from 4 in equations (3) and Bayes rule $\gamma_k(s,s') = p(s, y(k)|s')$ $= p(y(k)|s,s') p(s|s')$ 2 Define $d(k)$ = input bit necessary to cause the transistion from state $S(k-1) = s'$ to $S(k) = s$ $p(d(k))$ = a-priori probability of $d(k)$ $x(k)$ = transmitted codeword symbols defines the transition from $S(k-1) = s'$ to $S(k) = s$ $= \{x(k, b)\}$ where $b$ refers to the codeword bit $y(k)$ = received codeword symbols for codeword/clock $k$ $\{y(k, b)\}$ where $b$ refers to the codeword bit 3 With these definitions and the memoryless assumption, the $\gamma_k(s,s')$ equation in 1 becomes $\gamma_k(s, s') = p(y(k)|s, s') p(d(k))$ $= p(y(k)|x(k)) p(d(k))$ $= \prod_b p(y(k, b)|x(k, b)) p(d(k))$ 4 Assume the channel is Gaussian and the symbols are BPSK $\gamma_k(s,s') = \Pi_b \exp(-|y(k,b)-x(k,b)|^2/2\sigma^2)(2\pi)^{1/2}\sigma^* p(d(k))$ 5 The DM from 3 in equations (1) can be rewritten $$DM(s|s') = \sum_b DM(y(k, b), x(k, b))$$

$$= \sum_b -|y(k, b) - x(k, b)|^2 / 2\sigma^2$$

6 Log equation for $\underline{\gamma}_k(s,s')$ takes the log, uses DM, and deletes the additive constant $\underline{\gamma}_k(s,s') = DM(s|s') + \underline{p}(d(k))$ wherein $\underline{p}(d(k)) = \log(p(d(k)))$ the decoder trellis state $S(k-1) = s'$ transitioning to the next state $S(k) = s$ symbolically written as $s' \to s$. Step 1 applies Bayes rule to the definition of $\gamma_k(s,s')$ in 4 in equations (3). Step 2 are definitions. Step 3 uses these definitions to transform the $\gamma_k(s,s')$ into the product of the conditional probabilities $p(y(k)|x(k))$ of the received codeword symbols $\{y(k)\}$ given the transmitted codeword symbols $\{x(k)\}$, and the a-priori probability $p(d(k))$ causing this transition. The $p(y(k)|x(k))$ is the product over the bits $b=1, 2, \ldots$ for the #1 or #2 encoders in FIG. 1 depending on which is being addressed, of the probabilities for each bit $p(y(x,b)|x(k,b))$.

Step 4 introduces the standard turbo code assumption that the channel is Gaussian and uses BPSK (Binary phase shift keying) symbols which means $d(k)=+/-1$ when interpreted as a BPSK symbol, and $\sigma$ is the one sigma Gaussian inphase and quadrature noise. Step 5 observes that the DM metric is a function of the states $s,s'$ which is equal to the sum of the DM metrics over the bits $\{b\}$ of the codeword corresponding to the transition from $S(k-1)=s'$ to $S(k)=s$. In step 6 the equation for the log, $\underline{\gamma}k(s,s')$, of $\underline{\gamma}_k(s,s')$ as a function of the DM metric and the log, $\underline{p}(d(k))$, of $p(d(k))$ is used in turbo decoding algorithms, and in convolutional decoding algorithms when $\underline{p}(d(k))$ is deleted.

Log equations for $\underline{\alpha}_k(s), \underline{\beta}_{k-1}(s')$ are derived in equations (7) from equations (4),(5) respectively for $\alpha_k(s), \beta_{k-1}(s')$ using the definition of $\gamma_k(s,s')$ in 6 in equations (6). Step 1 gives the log equation for $\underline{\alpha}_k(s)$ by taking the (7) Log Equations for $\underline{\alpha}_k(s), \underline{\beta}_{k-1}(s')$
1 Log, $\underline{\alpha}_k(s)$, of $\alpha_k(s)$ $\underline{\alpha}_k(s) = \ln [\Sigma_{all\ s'} \exp(\underline{\alpha}_{k-1}(s') + DM(s\ s') + \underline{p}(d(k))]$ 2 Log, $\underline{\beta}_{k-1}(s')$, of $\beta_{k-1}(s')$ $\underline{\beta}_{k-1}(s') = \ln [\Sigma_{all\ s} \exp(\underline{\beta}_k(s) + DM(s|s') + \underline{p}(d(k))]$ log of the $\alpha_k(s)$ equation in 5 in equations (4) and using the definition of $\underline{\gamma}_k(s,s')$ in 6 in equations (6). Step 2 takes the log of the equation for $\beta_{k-1}(s')$ in 3 in equations (5) to derive the log equation for $\underline{\beta}_{k-1}(s')$ and uses the same definition for $\underline{\gamma}_k(s,s')$.

MAP equations for the log likelihood ratio $L(d(k)|y)$ are derived in equations (8). Step 1 is the definition from references [1],[2]. Step 2 uses the Bayes rule $P(a,b)=P(a|b)P(b)$ with the $p(y)$ cancelled in the division. Step 3 replaces $p(d(k))$ with the (8) MAP Equations
1 Definition $L(d(k))|y) = \ln [p(d(k)=+1|y)]$ $-\ln [p(d(k)=-1|y)]$ 2 Bayes rule allows this to be rewritten $$L(d(k)|y) = \ln[p(d(k)=+1,y)]$$
$$-\ln[p(d(k)=-1,y)]$$

3 Probability of p(d(k)) is the sum of the probabilities that the state S(k−1)=s' transitions to S(k)=s for the assumed values d(k)=+1 and d(k)=−1

$$L(d(k)|y) = \ln[\Sigma_{(s,s'|d(k)=+1)} p(s,s',y)]$$
$$-\ln[\Sigma_{(s,s'|d(k)=-1)} p(s,s',y)]$$

4 MAP equation is obtained by substituting the $\underline{\alpha}_{k-1}(s')$, $\underline{\beta}_k(s)$, $\gamma_k(s,s')$ into 3

$$L(d(k)|y) = \ln\left[\sum_{(s,s'|d(k)=+1)} p(s,s',y)\right] -$$
$$\ln\left[\sum_{(s,s'|d(k)=-1)} p(s,s',y)\right]$$
$$= \ln\left[\sum_{(s,s'|d(k)=+1)} \exp(\underline{\alpha}_{k-1}(s') + DM(s|s') + \underline{p}(d(k)) + \underline{\beta}_k(s))\right] -$$
$$\ln\left[\sum_{(s,s'|d(k)=-1)} \exp(\underline{\alpha}_{k-1}(s') + DM(s|s') + \underline{p}(d(k)) + \underline{\beta}_k(s))\right]$$

5 Decide $$d(k) = +1 \text{ when } L(d(k)|y) \geq 0$$
$$= -1 \text{ when } L(d(k)|y) < 0$$

equivalent sum of the probabilities that the transition from S(k−1)=s' to S(k)=s occurs for d(k)=+1 and for d(k)=−1. Step 4 substitutes the log of the recursive estimators $\underline{\alpha}_{k-1}(s')$, $\underline{\beta}_k(s)$, from 1,2 in equations (7) and the state transition probability $\gamma_k(s,s')$ from 6 in equations (6). In step 5 the hard decisioning rule is d(k)=+/−1 iff L(d(k)|y)≧/<0 and the soft decisioning metric is the value of L(d(k)|y).

MAP turbo decoding iterative algorithm is defined in FIG. 3 and in equations (9) for a parallel architecture using the MAP a-posteriori equation in equations (8) with BPSK (Binary Phase Shift Keying) modulation. This basic algorithm is used to illustrate how the decisioning metric DM is implemented, and is representative of how the DM metric is used for the more efficient algorithms such as the Log-MAP, Max-Log-MAP, iterative SOVA, and others, for parallel and serial architectures and other variations, and for modulations other than BPSK.

FIG. 3 inputs are the detected soft output symbols 18 from the received channel demodulator which detects and recovers these symbols. This stream of output symbols consists of the outputs {y(k,b=1)} for the systematic bit b=1 which is the uncoded bit, the subset of the output symbols from #1 encoder 3 in FIG. 1, and the remaining output symbols from #2 encoder 5 in FIG. 1. Systematic bits are routed to both #1 decoder 22 and #2 decoder 25. Encoded bits from #1 and #2 encoders are separately routed 19 to #1 and #2 decoders. The detailed decoding in FIG. 3 will be described in parallel with the MAP turbo decoding iterative algorithm in equations (9).

In equations (9), step 1 defines the various parameters used in the turbo decoding iterations.

Step 2 starts iteration i=1 in FIG. 3 for #1 decoder 22. Extrinsic information $L_{1e}$ from this decoder 22 in FIG. 3 for i=1 is calculated in step 2 in equations (9) using the soft outputs {y(k,b=1)} 20 of the received channel for the systematic bit b=1 which is the uncoded bit, the subset of the detected output symbols 19 which are from #1 decoder 3 in FIG. 1, and the #1 decoder likelihood ratio output $L_1$ calculated from 4 in equations 8. The a-priori information on p(d(k)) in 4 in equations (8) from #2 decoder 25 is not available so $\underline{p}(d(k))=0$ corresponding to p(d(k)=+1)= p(d(k)=−1)=½.

(9) MAP Turbo Decoding Iterative Algorithm

Step 1 Definitions $L_m = \{L(d(k)|y)\}, k = 1, 2, \ldots\}$ for $m = \#1, \#2$ decoders
= a-posteriori likelihood ratio $L_{me} = \{L_{me}(d(k)|y)\}, k = 1, 2, \ldots\}$
= extrinsic information from $m = \#1, \#2$ decoder
= a-priori estimates of $\ln[p(d=+1)/p(d=-1)]$ which defines $\underline{p}$ for the other decoder using equations (10) to solve for $\underline{p}$ $\tilde{L}_{1e}$=Interleaved $L_{1e}$
$\tilde{L}_{2e},\tilde{L}_2$=De-interleaved $L_{2e}, L_2$
y(k,b=1)=y for uncoded bit b=1
$\tilde{y}$(k,b=1)=interleaved y for uncoded bit b=1
Step 2 Iteration i=1 starts the turbo decoding $L_{1e}=L_1-0-(2/\sigma^2)Re[y(k,b=1)]$ $L_{2e}=L_2-\tilde{L}_{1e}-(2/\sigma^2)Re[\tilde{y}(k,b=1)]$ where Re(o)=Real(o)
Step 3 For iteration i=2, 3, . . .

$L_{1e}=L_1-\tilde{L}_{2e}-(2/\sigma^2)Re[y(k,b=1)]$ $L_{2e}=L_2-\tilde{L}_{1e}-(2/\sigma^2)Re[\tilde{y}(k,b=1)]$ Step 4 Decode after last iteration
Decide $\hat{d}(k)=+1/-1\equiv 1/0$ bit value
for $\tilde{L}_2(d(k)|y)\geq/<0$ for k=1, 2, . . .
where $\hat{d}(k)$ is the estimate of d(k) from turbo decoding
Step 2 next proceeds to #2 decoder 25. A-priori estimates for $\underline{p}(d(k))$ are calculated from the extrinsic information from #1 decoder after interleaving 23 in FIG. 3 in order to align the bits with the interleaved bits 4 in FIG. 1 which are encoded by the #2 encoder 5. Calculation of the a-priori $\underline{p}$ for #1,#2 decoder using the extrinsic information from #2,#1 decoder is given in equations (10) from references [2],[4]. Inputs to the

(10) A-Priori Calculation of $\underline{p}$ in 4 in Equations 8

$K=[1+\exp(\tilde{L}_{me})]$ $\underline{p}(d(k)=-1)=-\ln(K)$ $\underline{p}(d(k)=+1)=\tilde{L}_{me}-\ln(K)$

2 decoder 25 in FIG. 3 are the detected output symbols 19 from the #2 encoder 5 in FIG. 1, the detected symbols for the systematic bits 21 after interleaving 24, and the extrinsic information from #1 decoder 22 after interleaving 23. Calculation of the extrinsic information $L_{2e}$ from #2 decoder is given in step 2 in equations (9).

Step 3 repeats step 2 with the subtraction of the de-interleaved 26 extrinsic information input $\tilde{L}_{2e}$ to #1 decoder 22 from #2 decoder 25. This $\tilde{L}_{2e}$ is used to calculate the a-priori probabilities $\underline{p}$ using equations (10) for use in the evaluation of the a-posterior likelihood ratio $L_1$ from decoder #1, and also used in the calculation of the extrinsic information Lie for decoder #1 in step 3 in equations (9).

Step 4 is the calculation of the estimates {d̂(k)} for the transmitted information {d(k)} in the form of +/−1 used in the iterative algorithm to model the BPSK modulation with values +/−1 for the estimated input signal {d̂(k)} in 28 with +1 corresponding to the bit value 1 and −1 for the bit value 0. The de-interleaved 27 a-posteriori maximum likelihood ratio $\tilde{L}_2$ from #2 decoder in FIG. 3 yields these output bits 28 using the hard decisioning rule that decides 1/0 depending on whether the $\tilde{L}_2$ is $\geq 0$ or $<0$.

Convolutional decoding will be discussed in the disclosure of the new invention.

FIG. 4 is a representative demodulation receiver block diagram for implementation of the turbo decoder in FIG. 3 and the convolutional decoder in FIG. 8, which emphasizes the demodulation processing for both single and multiple channels. The signal processing starts with the user transmitted wavefronts 29 incident at the receiver antenna for the $n_u$ users u=1, . . . , $n_u \leq N_c$. These wavefronts are combined by addition in the antenna to form the receive Rx signal $\hat{v}(t)$ at the antenna output 30 where $\hat{v}(t)$ is an estimate of the transmitted signal v(t) 17 in FIG. 2, that is received with errors in time $\Delta t$, frequency $\Delta f$, phase $\Delta \theta$, and with an estimate $\hat{z}(t)$ of the transmitted complex baseband signal z(t) 14 in FIG. 2. This received signal $\hat{v}(t)$ is amplified and downconverted by the analog front end 31 and then synchronized and analog-to-digital ADC converted 32. Outputs from the ADC are handed over to the multiple access channel recovery signal processing 33 and the demodulation processing 34 where the waveform is removed to recover the symbols 35. These detected symbols 35 are turbo/convolutional decoded 36 to recover estimates {d̂(k)} of the received data which are processed by the frame processor 37 to recover estimates 38 of the transmitted user data words. The serial processing for the multiple access channel recovery and the demodulator is combined for several of the multiple access schemes and for the demodulation such as GMSK. As noted in the discussion for FIG. 2, the frame processing can be before and/or after the turbo decoder.

It should be obvious to anyone skilled in the communications art that this example implementation clearly defines the fundamental current turbo and convolutional encoding and decoding signal processing relevant to this invention disclosure and it is obvious that this example is representative of the other possible signal processing approaches.

For cellular applications the transmitter description describes the turbo and convolutional encoding transmission signal processing applicable to this invention for both the hub and user terminals, and the receiver describes the corresponding turbo and convolutional decoding receiving signal processing for the hub and user terminals for applicability to this invention.

For optical communications applications the microwave processing at the front end of both the transmitter and the receiver is replaced by the optical processing which performs the complex modulation for the optical laser transmission in the transmitter and which performs the optical laser receiving function of the microwave processing to recover the complex baseband received signal with the remainder of the signal processing functionally the same as described in FIG. 2 for the turbo and convolutional encoding transmitter and in FIG. 4 for the turbo and convolutional decoding receiver.

SUMMARY OF INVENTION

This invention introduces a new decisioning metrics in this invention for turbo decoding and convolutional decoding, a new MAP joint probability for turbo decoding, a new formulation to replace the ML probability for convolutional decoding, and the corresponding new estimators that replace the current recursive estimators $\alpha_{k-1}, \beta_k$, and the new replacement for the state transition probability $\gamma_k$ used for both convolutional and turbo decoding. It will be apparent to the reader that these probability equations together with the decisioning metrics provide new mathematical framework for the decoding algorithms, and offer an improvement in BER performance, rate of convergence for turbo decoding, and lower implementation complexities.

The MAP joint probability for turbo decoding is p(s,s',y) defined in 3 in equations (2), where s,s' are the decoding states for symbol sets k,k−1 respectively and y is the complete set of observed symbol sets for k=1, 2, . . . , N. The current practice uses the p(s,s',y) in the MAP equations (8) wherein the MAP a-posteriori log likelihood ratio L(d(k)|y) in 3 in equations (8) reduces to the natural log of the ratio of the sum of p(s,s',y) over s,s' for d(k)=+1, to the sum of p(s,s',y) over s,s' for d(k)=−1.

The MAP joint probability p(s,s',y) was formulated to support the use of the maximum likelihood ML probability p(y|x) in 1 in equations (1) and the corresponding log form of the ML decisioning metric DM in 3 in equations (1), and to support the factoring into the product of the estimators $\alpha_{k-1}, \beta_k, \gamma_k$ in 4 in equations (3). This factoring in log form in 4 in equations (8) is equal to the sum of the log forms of these estimators $\alpha_{k-1}, \beta_k, \gamma_k$ which are used for all of the turbo decoding algorithms, as well as for the covolutional decoding algorithms upon deleting the a-priori $\underline{p}$ in $\gamma_k$ in 6 in equations (6).

ML maximizes p(y|x) with respect to x in order to find the best x which is equivalent to maximizing the decisioning metric DM in 3 in equations (1) equal to DM=−|y−x|$^2$/2$\sigma_2$ with respect to x where |y−x| is the geometric distance between x and y. This DM in 3 in equations (1) is the natural log of p(y|x) with the additive constant removed. Maximizing DM is equivalent to minimizing |y−x| and therefore selects the x which is closest to y as the ML choice for x. ML decisioning metric DM is used to make the bit decisions in turbo decoding as demonstrated in equations (7), (8), (9), and is used to select the best trellis paths in convolutional decoding as will be demonstrated in the disclosure of this invention.

The new MAP probability p(s,s'|y) is the a-posteriori probability of s,s' given the observations y. This is the correct formulation for the MAP probability from a probability theoretic viewpoint Ref. [8], and is made possible by the use of the a-posteriori probability p(x|y) for the probability of the transmitted symbol x given the observed symbol y, in place of the ML p(y|x) in equations (1). It will be demonstrated that by using the new MX decisioning metric DX, the p(s,s|y) in log form can be factored into the sum of the new recursive estimators which replace the $\underline{\alpha}_{k-1}$, $\underline{\beta}_k$ and the new state transition probability $\underline{p}_k$ that replaces $\gamma_k$ currently used for all of the turbo decoding algorithms, The new maximum a-posteriori algorithm MX replaces the maximum likelihood algorithm ML, and maximizes the a-posteriori probability p(x|y) of x conditioned on the observation y, with respect to the selection of x. Maximizing p(x|y) is equivalent to maximizing the natural log of p(x|y) and yields the new decisioning metric $DX=Re(yx^*)/\sigma^2-|x|^2/2\sigma^2+\underline{p}(x)$ wherein $\underline{p}(x)$ is the natural log of p(x), Re(o) is the real part of (o), and x* is the complex conjugate of x. MX and its decisioning metric DX select the x which is closest to y as the MX choice for x. In the disclosure of this invention it will be demonstrated that the MX decisioning metric DX can be used to make the bit decisions in turbo decoding and can be used to select the best trellis paths in convolutional decoding.

Without any mathematical analysis, it should be apparent that DX has less noise compared to DM since DX is linear in y whereas DM involves the square of the vector y. This lower noise level translates into an improved decisioning performance of DX compared to DM.

BRIEF DESCRIPTION OF THE DRAWINGS
AND THE PERFORMANCE DATA

The above-mentioned and other features, objects, design algorithms, and performance advantages of the present invention will become more apparent from the detailed description set forth below when taken in conjunction with the drawings wherein like reference characters and numerals denote like elements, and in which:

FIG. 1 is a representative block diagram of the implementation of a turbo encoder using a parallel architecture.

FIG. 2 is a representative implementation block diagram for the turbo encoder and the convolutional encoder transmitter.

FIG. 3 is a representative block diagram of the implementation of a turbo decoder using a parallel architecture.

FIG. 4 is a representative implementation block diagram for the turbo decoder and convolutional decoder receiver.

FIG. 5 plots the Monte Carlo simulation of the decisioning metric performance for the MX decisioning metric DX=ln [p(x|y)] and the ML decisioning metric DM=ln [p(y|x)] against the symbol y signal-to-noise power ratio S/N.

FIG. 6 plots the improvement in S/N against the symbol y S/N which improvement is the advantage in S/N from using the MX decisioning metric.

FIG. 7 is a representative block diagram of a convolutional encoder.

FIG. 8 is a representative block diagram of a convolutional decoder.

DISCLOSURE OF THE INVENTION

The invention provides new decisioning metrics and new probabilities and new equations for the turbo decoding and convolutional decoding, which together provide performance improvements and reduce the decoder implementation complexities for all decoding architectures. In this invention disclosure, the new decisioning metric will be derived and evaluated prior to the derivation of the new probability equations and algorithm examples for the new decoding architectures for turbo and convolutional codes.

The MX a-posteriori probability p(x|y) defines the decisioning metric DX for turbo and convolutional decoding wherein the DX is derived from the MX in equations (11). Step 1 uses the Bayes rule to derive MX p(x|y)

(11) MX Decisioning Metric DX
1 Bayes rule p(a,b)=p(a|b)p(b)=p(b|a)p(a) enables MX probability p(x|y) to be defined $p(x|y)=P(y|x)p(x)/p(y)$ 2 mL probability p(y|x) is $p(y|x)=((2\pi)^{1/2}\sigma)^{-1}\exp(-|y-x|^2/2\sigma^2)$ 3 Gaussian probability p(y) is $p(y)=((2\pi)^{1/2}\sigma)^{-1}\exp(-|y|^2/2\sigma^2)$ 4. Equations 2,3 yield the result for MX $p(x|y)=p(x)\exp(Re(yx^*)/\sigma^2-|x|^2/2\sigma^2)/(2\pi)^{1/2}\sigma$ 5 Taking the natural log yields DX $$DX = \ln[p(x|y)]$$
$$= Re(yx^*)/\sigma^2 - |x|^2/2\sigma^2 + \underline{p}(x)$$
$$= Re(yx^*)/\sigma^2 - |x|^2/2\sigma^2 + \underline{p}(d)$$

wherein
x*=complex conjugate of x
p(d)=p(x) since the symbol d corresponds to x
$\underline{p}(d)=\ln [p(d)]$ from the ML p(y|x) and the p(y), p(x). Step 2 is the ML p(y|x) as in 1 in equations (1). Step 3 defines p(y) as the Gaussian probability function. Step 4 derives the MX p(x|y) using the p(y|x) in 2 and dividing by the p(y) in 3. Step 5 takes the natural log of the MX a-posteriori probability in step 4 to derive the DX and wherein the a-priori probability p(d) of data word d is equal to the a-priori p(x) of the corresponding data symbol since x amplitude and phase encodes d.

FIG. 5 plots the Monte Carlo simulation decisioning performance 39 of the MX decisioning metric DX=ln [p(x|y)] 41 and the ML decisioning matric DM=ln [p(y|x)] 42 against the symbol y signal-to-noise power ratio S/N 40. Equation DM=ln [p{y|x}] assumes the additive constant is deleted. Decisioning metric performance 39 in the log domain is the difference between the correct and incorrect BPSK assumption for x. For the MX DX, the simulated performance metric is equal to ln [<p(x|y)>/<p(x'|y)>] where <(o)> is the Monte Carlo statistical average over 100K trials of (o), the p(x|y) is the correct decision for BPSK modulation, and p(x'|y) is the incorrect decision. A-priori probabilities of x,x' are equal which means p(x)=p(x')=½ so that the p(x)=p(x') cancels out in the DX metric. The performance metric for the ML DM is the same ln [<p(y|x}/p(y|x')>. It is apparent from the data 41,42 that the required S/N to support a given level for the DX metric is considerably less than required for the DM metric. This directly translates into an improved BER performance.

FIG. 6 plots the improvement in S/N 43 against the symbol y S/N 44 This improvement 45 in S/N from using the MX decisioning metric in FIG. 5 compared to the current. ML, is the increase in S/N required for the ML metric to equal the value measured for the MX metric. Over the range of S/N of interest which is 0 to 10 dB, there is a ~1.7 dB improvement in S/N which is significant and clearly translates into an improvement in BER. There are no other available means to offer this improvement for both turbo and convolutional decoding.

The new a-posteriori probability density p(s,s'|y) for MAP is written as a function of the independent observations {y(j<k), y(k), y(j>k)} in equations (12) using 1,2 in equations (2).

(12) New Map A-Posteriori Probability $p(s,s'|y)=p(s,s'|y(j<k),y(k)y(j>k))$

Recursive equation for p(s,s'|y) is derived in equations (13) following the steps in equations (3) for the p(s,s',y) recursive equations. Step 1 is the application of Bayes rule to partition the probability p(s,s'|y). Step 2 takes advantage of the assumption that the channel is memoryless to simplify the

(13) Recursive Formulation of p(s,s'|y)

1 Bayes rule p(a,b)=p(a|b)p(b) can be used to rewrite the p(s,s'|y) in equation (12)

$$p(s, s' \mid y) = p(s, s' \mid y(j < k), y(k), y(j > k))$$
$$= p(s \mid s', y(j < k), y(k), y(j > k)) *$$
$$p(s' \mid y(j < k), y(k), y(j > k))$$

where "*" is a multiply operation

2 Assuming the channel is memoryless $p(s,s'|y)=p(s|s',y(k),y(j>k))p(s'|y(j<k)$

3 The events {s',y(k)},{y(j>k)} are independent since the channel is memoryless so 2 can be factored $p(s,s'|y)=p(s|s',y(k))p(s|y(j>k))p(s'|y(j<k))$ 4 This equation can be rewritten as a function of the a-posteriori recursive estimators and a-posteriori state transition probability $p(s,s',y)=p_k(s|s')b_k(s)a_{k-1}(s')$ wherein by definition
$p_k(s|s')=p(s|s',y(k))$
$b_k(s)=p(s|y(j>k))$
$a_{k-1}(s')=p(s'|y(j<k))$ partitioning in step 1. Step 3 applies the identity p(a|b,c)=p(a|b)p(a|c) which is true when events b,c are independent p(b,c)=p(b)p(c), to re-partition the first factor into the product of two factors. Step 4 transforms the joint probability in step 3 derived as a product of three probabilities, into the equivalent product of the two new state estimators $a_{k-1}(s')$, $b_k(s)$ and the state transition probability $p_k(s|s')$ for the new MAP turbo decoding algorithm. The $p_k(s|s')$ calculates p(s|s', y(k)) for each state transition assumption s→s' for symbol set k.

These a-posteriori estimators $\alpha_k(s)$, $b_k(s)$, $p_k(s|s')$, are part of this invention disclosure and are clearly distinct from the current set of ML estimators $\alpha_{k1}(s')$, $\beta_k(S)$, $\gamma_k(s,s')$ in 4 in equations (3).

Forward recursive equation for $a_k(s)$ is derived in equations (14) as a forward recursion which is a function of the $p_k(s|s')$ and the previous state estimate $a_{k-1}(s')$. Step 1 starts with the definition of $a_k(s)$ which is derived from the equation for $a_{k-1}(s')$ in 4 in equations (13). Step 2 introduces the state s' by observing the probability summed over all values of s' is equal to the probability with s' excluded. Step 3 applies Bayes rule to partition the probabilities. In step 4 the assumption that the channel is memoryless enables the equation to be simplified to the form used in the MAP algorithm. In step 5,

(14) Forward Recursive Equation for $a_k(s)$

1 From the definition for $\alpha_{k-1}(s')$ in 4 in equations (13) we find $a_k(s)=p(s|y(j<k),y(k))$ 2 This probability can be written as the sum of joint probabilities over all possible states of s'

$a_k(s)=\Sigma_{all\ s}p(s,s'|y(j<k),y(k))$

3 Applying Bayes rule $a_k(s)=\Sigma_{all\ s}p(s|s',y(j<k),y(k))p(s'|y(j<k),y(k))$ 4 Applying the channel memoryless assumption $\alpha_k(s)=\Sigma_{all\ s}p(s|s',y(k))p(s'|y(j<k))$ 5 Substituting the definitions of $p_k(s|s',y(k))$ and $a_{k-1}(s')$ from 4 in equations (13)

$a_k(s)=\Sigma_{all\ s}p_k(s|s')a_{k-1}(s')$ substitution of $p_k(s|s',p(k))$ and $a_{k-1}(s')$ from 4 in equations (13) gives the final form for the recursive equation for $\alpha_k(s)$.

Backward recursive equation for $b_{k-1}(s')$ is derived as a backward recursion in equations (15) as a function of the $p_k(s'|s)=p(s'|s)$ and the previous estimate $b_k(s)$, following the steps in equations (14). Step 1 derives $b_{k-1}(s')$ from the equation for $b_k(s)$ in 4 in equations (13). Step 2 is similar to steps 2, 3, 4 in equations (14). In step 3, using the(equality

(15) Backward Recursion Equation for $b_{k-1}(s')$

1 The definition for $b_k(s)$ from 4 in equations (13)

$b_{k-1}(s')=p(s'|y>k-1)$

2 Similar to the steps 2, 3, 4 in equations (4), we find $b_{k-1}(s')=\Sigma_{all\ s}p(s|y(j>k))p(s'|s,y(k))$ 3 Substituting the definitions of $b_k(s)$ from 4 in equations (13)

$b_{k-1}(s')=\Sigma_{all\ s}b_k(s)p_k(s'|s)$ p(s'|s,y(k))=p(s|s',y(k) which is equivalent to the equality $p_k(s'|S)=p_k(s|s')$ and substitution of $p_k(s|s')$ from 4 in equations (13) gives the final form for the recursive equation for $b_{k-1}(s')$. The equality $p_k(s|s)=p(s|s')$ simply recognizes that they are defined by the same MX equations as well as the same decisioning metric DX.

Log of the state transition probabilities $p_k(s|s')=p_k(s'|s)$ are derived in equations (16). The $p_k(s|s')$ is the probability of the decoder trellis state S(k−1)=s' transitioning to the next state S(k)=s given the observation y(k). For the backward recursion, the $p_k(s'|s)$ is the probability of the decoder trellis state S(k)=s transitioning from the previous state S(k−1)=s' given the observation y(k). In step 1 we rewrite the definition of $p_k(s|s')$ in 4 in equations (13) as the probability of the state transition s'→s given the observation y(k). Step 2 rewrites 1 as the equivalent probability of the transmitted symbol x(k) corresponding to the transition s'→s. Step 3 are definitions similar to 2 in equations (6). Step 4 expands the equations in 2 into a product over the codeword bits for the #1 and #2 encoders 3 and 5 respectively in FIG. 1, of the

(16) State Transition Probabilities $p_k(s|s')=p_k(s'|s)$

1 The $p_k(s|s')$ is defined in 4 in equations (13)

$$p_k(s \mid s') = p(s \mid s', y(k))$$
$$= p(s' \to s \mid y(k))$$

2 Since the transition s'→s is defined by x(k)

$p_k(s|s')=p(x(k)|y(k))$

Definitions 2 in equations (6) have the properties
  d(k)=input data corresponding to x(k)
  p(d(k))=p(x(k)), =a-priori probability of d(k)
  x(k)={x(k,b)}, b refers to the codeword bits
  y(k)={y(k,b)}, b refers to the codeword bits
  4 These definitions and the memoryless assumption, enable equations 2 to be expanded $$p_k(s \mid s') = p(x(k) \mid y(k))$$
$$= \Pi_b p(x(k,b) \mid y(k,b))$$

5 Using 4 in equations (11) enables this equation to be rewritten $$p_k(s \mid s') = \Pi_b [(2\pi)^{1/2} \sigma]^{-1} \exp(DX(k,b))$$
$$= p_k(s' \mid s)$$

6 MX decision metrics are from 6 in equations (11)

$$DX = DX(s \mid s')$$
$$= \Sigma_b DX(k,b)$$
$$= \Sigma_b \mathrm{Re}[y(k,b)x*(k,b)]/\sigma^2 - |x(k,b)|^2/2\sigma^2 + \underline{p}(d(k))$$
$$= DX(s' \mid s)$$

7 Log equations for $\underline{p}_k(s \mid s') = \underline{p}_k(s' \mid s)$ are the log of 5 using 6

$$p_k(s \mid s') = DX(s \mid s')$$
$$= DX(s' \mid s)$$
$$= p_k(s' \mid s)$$

probabilities for each bit p(x(k,b)|y(k,b)). Step 5 introduces the standard turbo code assumption that the channel is Gaussian and uses BPSK (Binary phase shift keying) symbols which means d(k)=+/−1 identical to the starting assumptions for equations (11), with σ equal to the one sigma Gaussian noise along the inphase and quadrature axes.

Step 6 generalizes the MX decisioning metric DX in 6 in equations (11) for p(x|y)=p(x|y), to DX(k,b) for p(x(k,b)|y(k,b))=f(x(k,b)|y(k,b)), and to DX(s|s')=DX(s'|s) equal to the sum of the DX(k,b) over all s→s' and s'→s transitions respectively, which is the sum over all bits {b} for clock k equal to codeword k. Step 7 takes the log of 5 and deletes the additive constants to give the log equations for the state transition probabilities $\underline{p}_k(s \mid s') = \underline{p}_k(s' \mid s)$ as linear sums of the DX(s|s'),DX(s'|s) and the log of the a-priori data probability $\underline{p}(d(k))$. The $\underline{p}_k(s \mid s') = \underline{p}_k(s' \mid s)$ will be used in turbo decoding algorithms, and in convolutional decoding algorithms when the log a-priori probability $\underline{p}(d(k))$ is deleted.

Log equations for $\underline{a}_k(s)$, $\underline{b}_{k-1}(s')$ are derived in equations (17) from equations (14), (15) respectively for $a_k(s)$, $b_{k-1}(s')$ using the definition of $\underline{p}_k(s \mid s')$ in 7 in equations (16). Step 1 gives the log equation for $\underline{a}_k(s)$ by taking the log of the $a_k(s)$

(17) Log Equations for the A-Posteriori Metrics $\underline{a}_k(s)$, $\underline{b}_{k-1}(s')$
  1 Log, $\underline{a}_k(s)$, of $a_k(s)$ $$\underline{a}_k(s) = \ln \left[ \Sigma_{all\ s} \exp(\underline{a}_{k-1}(s') + DX(s \mid s')) \right]$$

2 Log, $\underline{b}_{k-1}(s')$, of $b_{k-1}(s')$ $$\underline{b}_{k-1}(s') = \ln \left[ \Sigma_{all\ s} \exp(\underline{b}_k(s) + DX(s' \mid s)) \right]$$

equation in 5 in equations (14) and using the definition of $\underline{p}_k(s|s')$ in 7 in equations (16). Step 2 takes the log of the equation for $b_{k-1}(s')$ in 3 in equations (15) to derive the log equation for $\underline{b}_{k-1}(s')$ and uses the definition for $\underline{p}_k(s|s')$ in 7 in equations (16).

The new MAP equations for the log likelihood ratio L(d(k)|y)) are derived in equations (18). Step 1 is the definition from references [1],[2]. Step 2 replaces p(d(k)) with the equivalent sum of the probabilities that the transition from S(k−1)=s' to S(k)=s occurs and which are the new probabilities p(s,s'|y) over these transitions. Step 3 substitutes the log of the recursive estimators $\underline{a}_{k-1}(s'), \underline{b}_k(s)$, from 1,2 in equations (17) and the $\underline{p}_k(s|s')$ from 7 in equations (16). Step 4

(18) The New MAP Equations
  1 Definition $$L(d(k))|y) = \ln [p(d(k) = +1|y)]$$
$$- \ln [p(d(k) = -1|y)]$$

2 Probability of p(d(k)) is the sum of the probabilities that the state S(k−1)=s' transitions to S(k)=s $$L(d(k))|y) = \ln [\Sigma_{(s,s'|d(k)=+1)} p(s,s'|y)]$$
$$- \ln [\Sigma_{(s,s'|d(k)=-1)} p(s,s'|y)]$$

3 The new MAP equation is obtained by substituting the $\underline{a}_{k-1}(s'), \underline{b}_k(s), \underline{p}_k(s|s')$ $$L(d(k)) \mid y) = \ln[\Sigma_{(s,s'\mid d(k)=+1)} p(s,s' \mid y)] -$$
$$\ln[\Sigma_{(s,s'\mid d(k)=-1)} p(s,s' \mid y)]$$
$$= \ln[\Sigma_{(s,s'\mid d(k)=+1)} \exp(\underline{a}_{k-1}(s') + DX(s \mid s') + \underline{b}_k(s))] -$$
$$\ln[\Sigma_{(s,s'\mid d(k)=-1)} \exp(\underline{a}_{k-1}(s') + DX(s \mid s') + \underline{b}_k(s))]$$

3 Hard decisioning rule $$d(k) = +1/-1 \text{ when } L(d(k)|y) \geq 0/<0$$

5 Soft decision metric=L(d(k))|y gives the hard decisioning rule. Step 5 identifies L(d(k) y) to be the soft decisioning metric.

FIG. 1 describing a representative turbo encoding block diagram for a parallel architecture and FIG. 2 describing a representative implementation block diagram of a turbo encoder and transmitter apply to the invention.

FIG. 3 describing a representative turbo decoding block diagram and FIG. 4 describing a representative receiver block diagram for a turbo decoder receiver, apply to the invention when the turbo decoding signal flow diagram in FIG. 3 implements the MAP iterative algorithm in equations (9) using the likelihood ratios in equations (18). The decisioning metric performance advantage of −1.7 dB in FIGS. 5,6 will support a BER improvement in the MAP algorithm (9).

Convolutional decoding starts with the assumption of a sequence of observed channel output symbols {y(k), k=1, 2, ..., N} of the receiver where "k" is the running index over the N transmitted symbols. Each set y(k) of symbols at clock k consists of the observed uncoded and coded symbols for the received codeword k at clock k. These are the same starting set of assumptions used for turbo decoding.

FIG. 7 is a representative convolutional encoder block diagram. Input 46 to the encoder are the user data bits {d(k)} for k=1, 2, ..., N. The encoder for a convolutional code uses a recursive systematic code RSC or a systematic code SC which means the first codeword bit 47 is the user data bit called systematic bit, or bits, which are uncoded. These user data bits {d(k)} are also handed over to the encoder 48 followed by interleaving 49. Output bits 50 are punctured to obtain the correct code rate and multiplexed 51 into a continuous output bit stream 52 of codewords {c(k)} for each of the codeword clocks k=1, 2, ... Each codeword c(k) 52 is a set of bits consisting of the systematic bits followed by the encoder and interleaver output bits 52.

FIG. 8 is a representative convolutional decoder block diagram. Inputs are the detected soft output symbols 53 from the received channel demodulator which detects and recovers these symbols. This stream of output symbols consists of the outputs for the systematic bit b=1 and the outputs from the interleaved and encoded bits. Following de-interleaving 54 the convolutional decoder recovers estimates {d̂(k)} of the user input bits {d(k)} to the convolutional encoder.

Convolutional decoding solves the recursive equations derived from equations (7) by replacing the summations over all possible transitions with the best transition path to each of the transitions with the best transition path to each of the new trellis states. The best transition path for convolutional decoding is the best choice of s' for each forward path s'→s and the best choice of s for each backward path s→s', where best is the maximum value of the state metric for the path transitions.

For the forward recursion the log ML equations are derived in equations (19) using the redefined state path metric $\underline{\alpha}_k(s)$ and the state transition decisioning function DM. Step 1 is the

(19) Forward Equations for ML Convolutional Decoding

1 The ML probability density has the well-known factorization assuming a memoryless channel $$p(y(k)|s) = \Pi_{j=1,\ldots,k-1} p(y(j)|s_{j-1} \to s_j)$$
$$= p(y(k)|s' \to s)p(y(k-1)|s')$$

2 State path metric $\underline{\alpha}_k(s)$ in log format is $$\underline{\alpha}_k(s) = \underline{p}(y(k)|s)$$

3 Forward equations for $\underline{\alpha}_k(s)$ are derived using 2 and the log of 1 to yield $$\underline{\alpha}_k(s) = \max_{s'}[\underline{p}(y(k-1)|s') + \underline{p}(y(k)|s' \to s)]$$
$$= \max_{s'}[\underline{\alpha}_{k-1}(s') + DM(s|s')]$$
$$DM(s|s') = \underline{p}(y(k)|s' \to s)]$$
$$= -|y(k) - x(k)|^2/2\sigma^2$$

factorization of the ML probability that is allowed by the memoryless channel assumption. Step 2 is the definition of the path metric $\underline{\alpha}_k(s)$ in log format which is different from its definition in 1 in equations (4) for MAP turbo decoding. Step 3 derives the forward recursive equation for $\underline{\alpha}_k(s)$ by combining the equations in 1 and 2 and using the definition of the ML decisioning metric DM=ln [p(y(k)|s'→s)]=p(y(k)|s'→s)] for the path s'→s for convolutional decoding. Path metrics and the corresponding data d(k) bit for each trellis state are stored in a state matrix. The best path corresponding to decoding state k is used to select the best data d(k−D) bit decision at the state k−D of this path stored in the state matrix, where D is a delay in the data bit decisioning that is required for reliable decoding.

For the backward recursion the log ML equations are derived in equations (20) using the state path metric $\underline{\beta}_k(S)$ in 2 in equations (7), and the state transition probability $\underline{\gamma}_k(s,s')$ and decisioning metric DM(s|s') from 4, 5, 6 in equations (6). Step 1

(20) Backward Equations for ML Convolutional Decoding

1 State path metric $\underline{\beta}_{k-1}(s')$ in log format is equal to the value 1 in equation (5)

$$\underline{\beta}_{k-1}(s') = \ln[p(y(j > k-1), s')]$$
$$= p(y(j > k-1)|s')]$$

2 Backward equations for $\underline{\beta}_{k-1}(s')$ are derived using 1 and the 2,3 in equations (5) to yield $$\underline{\beta}_{k-1}(s') = \max_s[\underline{p}(y(j > k)|s) + \underline{p}(s, y(k)|s')]$$
$$= \max_s[\underline{\beta}_k(s) + DM(s|s')]$$
$$DM(s'|s) = -|y(k) - x(k)|^2/2\sigma^2$$

is the definition of $\underline{\beta}_{k-1}(s')$ in 1 in equations (5). Step 2 modifies the derivation of $\underline{\beta}_{k-1}(s')$ in equations (5) and the final equation for $\underline{\beta}_{k-1}(s')$ in 2 in equations (7) to derive the $\underline{\beta}_{k-1}(s')$ for the backward convolutional decoding, with the modifications being 1) setting the a-priori probability $\underline{p}(d(k))=0$ since there is no a-priori probability available, and 2) replacing the summation over all s with the maximum with respect to s of $[\underline{\beta}_k(s)+DM(s|s')]$. Path metrics and the corresponding data d(k) bit for each trellis state are stored in a state matrix. The best path corresponding to decoding state k is used to select the best data d(k+D) bit decision at the state k+D of this path stored in the state matrix, where D is a delay in the data bit decisioning that is required for reliable decoding.

The new convolutional decoding equations (21) for forward and backward recursions are modifications of the previously derived MAP equations for $\underline{a}_k(s)$ in equations (14), $\underline{b}_{k-1}(s')$ in equations (15), DX(s|s')=DX(s'|s) in equations (16), and the final equations for $\underline{a}_k(s)$, $\underline{b}_{k-1}(s')$ in 1, 2 in equations (17). Modifications consist of 1) setting $\underline{p}(d(k))=0$ since there is no a-priori information on p(d(k)), and 2) replacing the summation over all s',s with the maximum of $[\underline{a}_{k-1}(s')+DX(s|s')]$, $[\underline{b}_k(s)+DX(s|s)]$ respectively with respect to the path transition s'→s,s→s' respectively.

(21) The New A-Posteriori Convolutional Decoding Equations

1 Definition of $\underline{a}_k(s)$ from 1 in equations (14)

$\underline{a}_k(s)=\underline{p}(s|y(j\leq k)$

2 Forward recursion for $a_k(s)$ can be derived by modifying the derivation of $a_k(s)$ for the MAP turbo decoding to yield $$\underline{a}_k(s) = \max_{s'}[\underline{a}_{k-1}(s') + DX(s\,|\,s')]$$

$DX(s|s')]=Re[y(k)x^*(k)]/\sigma^2-|x(k)|^2/2\sigma^2+\underline{p}(d(k))$

3 Definition of $\underline{b}_{k-1}(s')$ from 1 in equations (15)

$\underline{b}_{k-1}(s')=p(s'|y(j>k-1))$

4 Backward recursion for $b_{k-1}(s')$ can be derived by modifying the derivation of $\underline{b}k-1(s')$ for the MAP turbo decoding to yield $$\underline{b}_{k-1}(s') = \max_{s}[\underline{b}_k(s) + DX(s'\,|\,s)]$$

$DX(s'|s)]=Re[y(k)x^*(k)]/\sigma^2-|x(k)|^2/2\sigma^2+\underline{p}(d(k))$

Step 1 for the new forward recursion uses the same definition of $\underline{a}_k(s)$ for the MAP turbo decoding in 1 in equations (14). Step 2 then follows the steps in equations (14), (16) leading to the equations 1 in equations (17) for $\underline{a}_k(s)$ for the MAP turbo decoding, upon replacing the summation over s' with the maximization with respect to s' similar to the derivation of the forward recursion equations for $\underline{\alpha}_k(s)$ in (19). Path metrics and the corresponding data d(k) bit for each trellis state are stored in a state matrix. The best path corresponding to decoding state k is used to select the best data d(k−D) bit decision at the state k−D of this path stored in the state matrix, where D is a delay in the data bit decisioning that is required for reliable decoding.

Step 3 for the new backward recursion uses the same definition of $\underline{b}_{k-1}(s')$ for the MAP turbo decoding in 1 in equations (15). Step 4 then follows the steps in equations (15), (16) leading to the equations 2 in equations (17) for $b_{k-1}(s')$ for the MAP turbo decoding, upon replacing the summation over s with the maximization with respect to s similar to the derivation of the backward recursion equations for $\beta_{k-1}(s')$ in (20). Path metrics and the corresponding data d(k) bit for each trellis state are stored in a state matrix. The best path corresponding to decoding state k is used to select the best data d(k+D) bit decision at the state k+D of this path stored in the state matrix, where D is a delay in the data bit decisioning that is required for reliable decoding.

Preferred embodiments in the previous description of the probabilities, decisioning metrics, algorithms, and implementations, are provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is intended to be accorded the wider scope consistent with the principles and novel features disclosed herein.

It should be obvious to anyone skilled in the communications art that these example probabilities, decisioning metrics, algorithms, and implementations, define the fundamental architecture and signal processing relevant to this invention disclosure and it is obvious that this example is representative of the other possible signal processing approaches.

For cellular applications the receiver description in FIG. 4 includes the new turbo decoding and the new convolutional decoding and describes the corresponding receiving signal processing for the cellular hub and user.

For optical communications applications the microwave processing at the front end of both the transmitter and the receiver is replaced by the optical processing which performs the complex modulation for the optical laser transmission in the transmitter and which performs the optical laser receiving function of the microwave processing to recover the complex baseband received signal.

What is claimed is:

1. A method for performing a new turbo decoding algorithm using a-posteriori probability p(s,s'|y) in equations (13) for defining the maximum a-posteriori probability MAP, comprising:

using a new statistical definition of the MAP logarithm likelihood ratio L(d(k)|y) in equations (18)

$L(d(k))|y)=\ln[\Sigma_{(s,s'|d(k)=+1)}p(s,s'|y)]$ $-\ln[\Sigma_{(s,s'|d(k)=-1)}p(s,s'|y)]$ equal to the natural logarithm of the ratio of the a-posteriori probability p(s,s'|y) summed over all state transitions s'→s corresponding to the transmitted data d(k)=1 to the p(s,s'|y) summed over all state transitions s'→s corresponding to the transmitted data d(k)=0, using a factorization of the a-posteriori probability p(s, s'|y) in equations (13) into the product of the a-posteriori probabilities $p(s,s'|y)=p(s|s',y(k))p(s|y(j>k))p(s'|y(j<k))$, using a turbo decoding forward recursion equation $p(s|y(j<k),y(k))=\Sigma_{all\,s}p(s|s',y(k))p(s'|y(j<k))$ DM=$[-|y(k)-x(k)|^2/2\sigma^2]$ which is a quadratic function of y(k), whereby said MAP turbo decoding algorithms provide some of the performance improvements demonstrated in FIG. 5,6 using said DX, and whereby this new a-posteriori mathematical framework enables said MAP turbo decoding algorithms to be restructured and to determine the intrinsic information as a function of said DX linear in said y(k).

2. A method for performing a new convolutional decoding algorithm using the MAP a-posteriori probability p(s,s'|y) in equations (13), comprising:

using a new maximum a-posteriori principle which maximizes the a-posteriori probability p(x|y) of the transmitted symbol x given the received symbol y to replace the current maximum likelihood principle which maximizes the likelihood probability p(y|x) of y given x for deriving the forward and the backward recursive equations to implement convolutional decoding, using the factorization of the a-posteriori probability p(s,s'|y) in equations (13) into the product of said a-posteriori probabilities p(s'|y(j<k)), p(s|s',y(k)), p(s|y (j>k)) to identify the convolutional decoding forward state metric $a_{k-1}(s')$, backward state metric $b_k(s)$, and state transition metric $p_k(s|s')$ as the a-posteriori probability factors $$p_k(s|s') = p(s|s', y(k))$$

$$b_k(s) = p(s|y(j>k))$$

$$a_{k-1}(s') = p(s'|y(j<k)),$$

using a convolutional decoding forward recursion equation in equations (14) for evaluating said a-posteriori probability $a_k(s) = p(s|y(j<k), y(k))$ using said $p_k(s|s') = p(s|s', y(k))$ as said state transition probability of the trellis transition path $s' \rightarrow s$ to the new state s at k from the previous state s' at k−1, using a convolutional decoding backward recursion equation in equations (15) for evaluating said a-posteriori probability $b_k(s) = p(s|y(j>k))$ using said $p_k(s'|s) = p(s'|s, y(k))$ as said state transition probability of the trellis transition path $s \rightarrow s'$ to the new state s' at k−1 from the previous state s at k, evaluating the natural logarithm of said state transition a-posteriori probabilities $$\ln[p_k(s'|s)] = \ln[p(s'|s, y(k))]$$
$$= \ln[p(s|s', y(k))]$$
$$= \ln[p_k(s|s')]$$
$$= DX$$

equal to a new decisioning metric DX in equations (16), and implementing said convolutional decoding algorithms to obtain some of the performance improvements demonstrated in FIG. 5,6 using said DX.

3. The method of claim 2 wherein for implementing the new convolutional decoding recursive equations, said method further comprising:

implementing in equations (14) a forward recursion equation for evaluating the natural logarithm, $\underline{a}_k$, of $a_k$ using the natural logarithm of the state transition a-posteriori probability $\underline{p}_k = \ln[p(s|s', y(k))]$ of the trellis transition path $s' \rightarrow s$ to the new state s at k from the previous state s' at k−1, which is equation $$\underline{a}_{k(s)} = \max_{s'}[\underline{a}_{k-1}(s') + \underline{p}_k(s|s')]$$
$$= \max_{s'}[\underline{a}_{k-1}(s') + DX(s|s')]$$
$$= \max_{s'}[\underline{a}_{k-1}(s') + \text{Re}[y(k)x*(k)]/\sigma^2 - |x(k)|^2/2\sigma^2 + \underline{p}(d(k))]$$

wherein said $DX(s|s') = \underline{p}_k(s|s') = \underline{p}_k(s'|s) = DX(s'|s) = DX$ is a new decisioning metric, and implementing in equations (15) a backward recursion equation for evaluating the natural logarithm, $\underline{b}_k$ of $b_k$ using the natural logarithm of said state transition a-posteriori probability $\underline{p}_k = \ln[p(s'|s, y(k))] = \ln[p(s|s', y(k))]$ of the trellis transition path $s \rightarrow s'$ to the new state s' at k−1 and is equation $$\underline{b}_{k-1}(s') = \max_s[\underline{b}_k(s) + DX(s'|s)].$$

* * * * *

UNITED STATES PATENT AND TRADEMARK OFFICE
CERTIFICATE OF CORRECTION

PATENT NO.        : 7,337,383 B1
APPLICATION NO.   : 10/772597
DATED             : February 26, 2008
INVENTOR(S)       : Urbain Alfred von der Embse It is certified that error appears in the above-identified patent and that said Letters Patent is hereby corrected as shown below:

In the drawings, Sheet 5, the word "our" in the title should be corrected to read "of".

In Claim 1, column 20, after line 43 please insert the missing page 2 of the submitted clean version of the Claims, which reads as follows:

"for evaluating said a-posteriori probability $p(s'\,|y(j<k))$ in equations (14) using $p(s|s'\,,y(k))$ as the state transition a-posteriori probability of the trellis transition path $s' \to s$ to the new state s at k from the previous state s' at k-1 and given the observed symbol y(k) to update these recursions for the assumed value of the user data bits d(k) equivalent to the transmitted symbol x(k) which is the modulated symbol corresponding to d(k),
using a turbo decoding backward recursion equation $$p(s'\,|y(j>k-1)) = \Sigma_{all\ s}\, p(s|y(j>k))p(s'\,|s,y(k))$$

for evaluating the a-posteriori probability $p(s|y(j>k))$ in equations (15) using said $p(s'\,|s,y(k)) = p(s|s',y(k))$ as the state transition a-posteriori probability of the trellis transition path $s \to s'$ to the new state s' at k-1 from the previous state s at k and given said observed symbol y(k) to update these recursions for said assumed value of d(k), evaluating the natural logarithm of the state transition posteriori probability $p(s|s',y(k))=p(s'\,|s,y)k))$ equal to a new decisioning metric DX in equations (11), (16), defined by equation $$\begin{aligned}\ln[p(s|s'\,,y(k)) &= \ln[p(s'\,|s,y(k))] \\ &= Re[y(k)x^*(k)]/\sigma^2 - |x(k)|^2/2\sigma^2 + \underline{p}(d(k)) \\ &= DX\end{aligned}$$

wherein $\underline{p}$ is the natural logarithm ln of p, $x^*$ is the complex conjugate of x, and ln [o] is the natural logarithm of [o],

UNITED STATES PATENT AND TRADEMARK OFFICE
CERTIFICATE OF CORRECTION

PATENT NO. : 7,337,383 B1
APPLICATION NO. : 10/772597
DATED : February 26, 2008
INVENTOR(S) : Urbain Alfred von der Embse It is certified that error appears in the above-identified patent and that said Letters Patent is hereby corrected as shown below:

whereby said new state transition probabilities in said MAP
    equations use said DX linear in y(k) in place of the
    current use of the maximum likelihood decisioning metric"

Signed and Sealed this

Twenty-second Day of July, 2008

JON W. DUDAS
*Director of the United States Patent and Trademark Office*